US012801031B2

(12) United States Patent
Choi et al.

(10) Patent No.: US 12,801,031 B2
(45) Date of Patent: Nov. 17, 2026

(54) MEASUREMENT OPTICAL SYSTEM FOR METROLOGY INSPECTION AND METHOD OF MEASURING OVERLAY USING THE SAME

(71) Applicant: SAMSUNG ELECTRONICS CO., LTD., Suwon-si (KR)

(72) Inventors: Kyuhwan Choi, Suwon-si (KR); Seunghoon Han, Suwon-si (KR); Changgyun Shin, Suwon-si (KR); Jaeduck Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 119 days.

(21) Appl. No.: 18/882,312

(22) Filed: Sep. 11, 2024

(65) Prior Publication Data

US 2025/0085642 A1 Mar. 13, 2025

(30) Foreign Application Priority Data

Sep. 11, 2023 (KR) ........................ 10-2023-0120490

(51) Int. Cl.
*G03F 7/00* (2006.01)

(52) U.S. Cl.
CPC .... *G03F 7/70633* (2013.01); *G03F 7/706847* (2023.05); *G03F 7/706849* (2023.05); *G03F 7/706851* (2023.05)

(58) Field of Classification Search
CPC ........... G03F 7/70633; G03F 7/706847; G03F 7/706849; G03F 7/706851; G03F 7/70641; G03F 7/70683; G01B 11/272; H10P 74/20; H10W 46/00; H10W 46/101; H10W 46/301
USPC .................................................. 356/399–401
See application file for complete search history.

(56) References Cited

U.S. PATENT DOCUMENTS

| | | | |
|---|---|---|---|
| 10,942,129 B2 | 3/2021 | Zhang et al. | |
| 2012/0036489 A1 | 2/2012 | Wang et al. | |
| 2020/0319447 A1* | 10/2020 | Fujishima | G02B 21/10 |
| 2022/0035258 A1* | 2/2022 | Lee | G03F 7/70633 |
| 2022/0074867 A1 | 3/2022 | Jung et al. | |

(Continued)

FOREIGN PATENT DOCUMENTS

KR 10-2022-0031834 A 3/2022

OTHER PUBLICATIONS

F. Kurz et al, "High Precision Low Temperature Direct Wafer Bonding Technology for Wafer-Level 3D ICs Manufacturing", ECS Transactions, vol. 75, No. 9, Aug. 24, 2016, pp. 345-353.

*Primary Examiner* — Isiaka O Akanbi
(74) *Attorney, Agent, or Firm* — Sughrue Mion, PLLC

(57) ABSTRACT

A measurement optical system and an overlay measurement method using the same are provided. The measurement optical system includes: a light source configured to emit infrared light; a light splitter configured to reflect, from the light source and to a subject, a first portion of the infrared light incident to the light splitter; a photodetector on a same optical axis as the light splitter and configured to receive a second portion of the infrared light reflected from the subject; a first lens optical system between the light splitter and the photodetector; and a second lens optical system between the first lens optical system and the photodetector, wherein the subject may include an alignment key on which a meta key is provided.

21 Claims, 16 Drawing Sheets

(56) References Cited

U.S. PATENT DOCUMENTS

| | | | | |
|---|---|---|---|---|
| 2023/0184546 | A1 * | 6/2023 | Lee | G01B 11/27<br>356/138 |
| 2023/0186460 | A1 * | 6/2023 | Lee | G06T 7/0004<br>348/87 |

* cited by examiner

MEASUREMENT OPTICAL SYSTEM FOR METROLOGY INSPECTION AND METHOD OF MEASURING OVERLAY USING THE SAME

CROSS-REFERENCE TO RELATED APPLICATION

This application is based on and claims priority under 35 U.S.C. § 119 to Korean Patent Application No. 10-2023-0120490, filed on Sep. 11, 2023, in the Korean Intellectual Property Office, the disclosure of which is incorporated by reference herein in its entirety.

BACKGROUND

1. Field

The disclosure relates to a semiconductor overlay measurement system, and more specifically, to a measurement optical system for MI and an overlay measurement method using the same.

2. Description of Related Art

As the degree of integration of semiconductor device increases, three-dimensional integrated circuit (3D IC) and bonding proceed in an accurate and precise manner. To this end, the degree of overlay of a substrate or a material layer is measured using metrology inspection (MI), wherein an alignment key is used. In order to measure the overlay of an alignment key, an Image Based Overlay (IBO) for measuring images of the alignment key or a Diffraction Based Overlay (DBO) for measuring interference patterns of the alignment key is used. Then, the overlay between material layers or bonding substrates may be measured through analysis of the obtained image or interference pattern.

SUMMARY

Provided is a measurement optical system for MI, which may be capable of increasing light detection intensity.

Provided is a measurement optical system for MI, which may be capable of measuring a smaller overlay.

Provided is an overlay measurement method using the measurement optical system.

Additional aspects will be set forth in part in the description which follows and, in part, will be apparent from the description, or may be learned by practice of the presented embodiments of the disclosure.

According to an aspect of an example embodiment, a measurement optical system includes: a light source configured to emit infrared light; a light splitter configured to reflect, from the light source and to a subject, a first portion of the infrared light incident to the light splitter; a photodetector on a same optical axis as the light splitter and configured to receive a second portion of the infrared light reflected from the subject; a first lens optical system between the light splitter and the photodetector; and a second lens optical system between the first lens optical system and the photodetector, wherein the subject may include an alignment key on which a meta key is provided.

The light source may include a wavelength variable light source.

The light source may include: a first light source configured to emit first infrared light; and a second light source configured to emit a second infrared light having a wavelength that is different from a wavelength of the first infrared light, and at least one of the first infrared light and the second infrared light may include the infrared light.

The light source may include: a first light source emitting configured to emit first infrared light; and a second light source configured to emit a second infrared light having a wavelength that is different from a wavelength of the first infrared light, and at least one of the first infrared light and the second infrared light may include the infrared light.

The measurement optical system a wavelength filter between the light source and the light splitter.

The measurement optical system may further include a third lens optical system between the light splitter and the first lens optical system.

The measurement optical system may further include a fourth lens optical system disposed between the light splitter and the subject.

The measurement optical system may further include a polarization filter between the light source and the light splitter.

The light splitter may be further configured to rotate about a single axis.

Tight source may be further configured to emit the infrared light to the light splitter such that the first portion of the infrared light reflected from the light splitter may be further obliquely incident on the subject.

The meta key may include: a first meta key configured to respond to vertical polarization of the infrared light; and a second meta key configured to respond to horizontal polarization of the infrared light.

The alignment key may include: a first alignment key; and a second alignment key spaced apart from the first alignment key, a first one of the first alignment key and the second alignment key is a non-meta key, and a second one of the first alignment key and the second alignment key is the meta key.

An entirety of the second one of the first alignment key and the second alignment key is the meta key.

The first one of the first alignment key and the second alignment key is entirely the non-meta key.

According to an aspect of an example embodiment, an overlay measurement method includes: measuring a first overlay by irradiating an alignment key with a first infrared light and by detecting a first reflected light reflected from the alignment key, the alignment key including a meta key and a first non-meta key; and measuring a second overlay by irradiating the alignment key with a second infrared light and by detecting a second reflected light reflected from the alignment key, the second infrared light having a wavelength that is different from a wavelength of the first infrared light, wherein a first one of the first overlay and the second overlay is measured based on the meta key, and a second one of the first overlay and the second overlay is measured based on the first non-meta key.

One of the measuring the first overlay and the measuring the second overlay may include measuring an overlay of 300 nm or more, and the other one of the measuring the first overlay and the measuring the second overlay of other may include measuring an overlay of 100 nm or less.

The alignment key may include: a first alignment key including the first non-meta key; and a second alignment key including the meta key, and the second alignment key is spaced apart from the first alignment key.

The second alignment key may include the meta key and a second non-meta key.

According to an aspect of an example embodiment, a method of measuring an overlay, includes: measuring the overlay in a first direction by irradiating an alignment key with a first polarized infrared light and by detecting a first reflection light reflected from the alignment key, the alignment key including a meta key; and measuring an overlay in a second direction perpendicular to the first direction by irradiating the alignment key with a second polarized infrared light and by detecting a second reflected light reflected from the alignment key, the second polarized infrared light having a polarization state that is perpendicular to a polarization state of the first polarized infrared light.

The meta key may include: a first meta key configured to respond to a vertical polarization; and a second meta key configured to respond to a horizontal polarization.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is obliquely incident onto an alignment key formed on a substrate;

DETAILED DESCRIPTION

Figure 1:
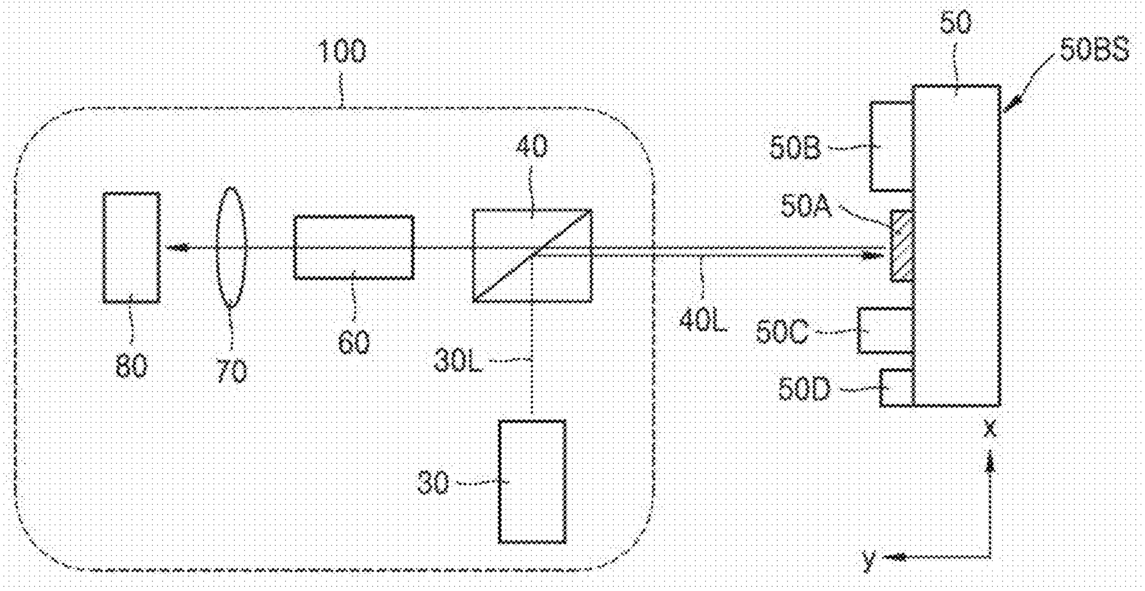
FIG. 1 is a block diagram showing a first measurement optical system for MI according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a measurement optical system for MI and an overlay measurement method using the same according to an exemplary embodiment will be described in detail with reference to the accompanying drawings. In the description, thicknesses of layers or regions illustrated in the drawing may be somewhat exaggerated for clarity of the specification.

The embodiments described below may be merely illustrative, and various modifications may be possible from these embodiments. Also, with respect to a layer structure described below, the expression, such as "upper" or "on" may include not only a being directly above in a contact state, but also a being above in a non-contact state. In the description below, the same reference numeral in each drawing denotes the same member.

A singular expressions includes plural expressions, unless clearly indicates otherwise in view of context. Also, when a part "includes" a component, this means that the other component may be further included, rather than excluding other component, unless otherwise specified.

If there is no explicit description of the steps constituting the method, the steps may be performed in an appropriate order. It is not necessarily limited to the order of description of the steps.

Also, terms such as "part" and "module" described in the specification refer to units that process at least one function or operation, which can be implemented as hardware or software or as a combination of hardware and software.

Line connection or connecting members between elements shown in the drawing exemplarily represent functional connection and/or physical or circuit connection, and in real devices, those line connections or connecting members may be represented as replaceable or additional, various functional connections, physical connections, or circuit connections.

The use of all examples or exemplary terms is simply to describe a technical idea in detail and it is not limited to the above examples or exemplary terms, unless limited by claims.

FIG. 1 is a block diagram illustrating a first measurement optical system 100 for MI according to the one exemplary embodiment.

Referring to FIG. 1, the measurement optical system 100 for MI according to the one exemplary embodiment may include a light source 30, a light splitter 40, a first lens optical system 60, a second lens optical system 70, and a photodetector 80. The measurement optical system 100 may further include other elements. The measurement optical system 100 may measure an offset or overlay of a substrate 50 with respect to a reference layer by measuring an image of an alignment key 50A formed on the substrate 50. According to one or more example embodiments, the substrate 50 may be a single material layer formed with the alignment key 50A. The reference layer may be a lower material layer on which the substrate 50 is formed. The reference layer is formed with a reference alignment key, which provides an alignment reference with respect to the alignment key 50A formed on the substrate 50. The reference alignment key may be expressed as a reference key. Such a reference alignment key may be formed to include features of the alignment key to be described later. According to one or more example embodiments, the substrate 50 may include a stack of multilayer structure having a number of material layers, wherein the material layers are sequentially stacked and each material layer includes the alignment key. The measurement optical system 100 may be prepared so as to measure the overlay of the multilayer structure by capturing an image of the alignment key of the multilayer structure. According to one or more example embodiments, instead of capturing an image of the alignment key 50A of the substrate 50, the measurement optical system 100 may measure an interference pattern from the light reflected from the alignment key 50A, and may measure the overlay of the material layer in which the alignment key 50A is formed from the measured interference pattern. Alternatively, the overlay of the material layer formed with the alignment key 50A may be measured by measuring the intensity of the light reflected from the alignment key 50A, and comparing the measured intensity of the light to a look-up table.

The measurement optical system 100 as a whole may be located at a side of the substrate 50, i.e., at a side facing the surface on which the alignment key 50A of the substrate 50 is formed. However the disclosure is not limited thereto. According to one or more example embodiments, the light splitter 40, the first lens optical system 60, the second lens optical system 70, and the photodetector 80 except for the light source 30 in the measurement optical system 100 may be arranged or provided to form the same optical axis as the alignment key 50A. The photodetector 80 may include a photographing device including an image sensor. According to one or more example embodiments, the photodetector 80 may include a camera. According to one or more example embodiments, the camera may include a digital camera with a built-in charge coupled device (CCD). The light splitter 40, the first lens optical system 60, and the second lens optical system 70 are provided between the photodetector 80 and the alignment key 50A. In other words, the second lens optical system 70, the first lens optical system 60, and the light splitter 40 may be sequentially arranged in the direction from the photodetector 80 to the alignment key 50A. The light source 30 and the light splitter 40 may be arranged to let the light emitted from the light source 30 be incident on the alignment key 50A through the light splitter 40. According to one or more example embodiments, the light source 30 may directly face the light splitter 40 so that the light emitted from the light source 30 is incident directly on the light splitter 40, but other elements may be further provided between the light source 30 and the light splitter 40 as described later. According to one or more example embodiments, the light source 30 may be provided so that light emitted from the light source 30 and incident on the light splitter 40 may be parallel or substantially parallel to the flat bottom surface 50BS of the substrate 50. According to one or more example embodiments, the light source 30 may be provided in a direction perpendicular to an optical axis shared by the light splitter 40, the first lens optical system 60, the second lens optical system 70, and the photodetector 80, so as to radiate light to the light splitter 40.

According to one or more example embodiments, the light source 30 may include a single light emitting source (a single optical source). According to one or more example embodiments, the single light source may be a wavelength-variable-type light source that can change the wavelength of light emitted according to the configuration of the alignment key 50A, and may be, for example, a wavelength-variable-type light source that emits laser light in the infrared band. According to one or more example embodiments, the infrared band may include infrared lights that make it possible to precisely and accurately obtain an image or an interference pattern for the alignment key 50A. According to one or more example embodiments, the infrared band may include short wavelength infrared (SWIR), but the disclosure is not limited to the short wavelength infrared. According to one or more example embodiments, the light source 30 may include a plurality of light emitting sources (a plurality of light sources) that emit lights of different wavelengths. According to one or more example embodiments, the plurality of light sources may include light sources emitting different infrared rays. According to one or more example embodiments, the different infrared lights may belong to the same infrared band. According to one or more example embodiments, the same infrared band may include SWIR. According to one or more example embodiments, each one of the light sources belonging to the plurality of the light sources may be the above-described wavelength variable type single light source or the wavelength non-variable type single light source.

The case where the light source 30 includes a single light source and the case where the light source 30 includes a plurality of light sources will be described later herein. The configuration of the light source 30 may be determined in consideration of the vertical and/or horizontal configuration of the alignment key 50A. When the vertical configuration of the alignment key 50A is such a structure as the overlapping of two or more alignment keys 50A stacked in a vertical direction (y axis direction) perpendicular to the substrate 50, at least the one of the two or more alignment keys may include an alignment key formed as a meta pattern (Herein below, it is referred to as meta key), and the other one may include a non-meta key (for instance, the alignment key according to a related art manner). In other words, the vertical configuration of the alignment key 50A is such that at least some of the two or more alignment keys stacked in the vertical direction may include the meta key, whereas the others may include a non-meta key. According to one or more example embodiments, the horizontal configuration of the alignment key 50A is referred to as the configuration of one alignment key in the direction parallel to the substrate 50 (x-axis direction). For example, when considering one alignment key selected from two or more alignment keys as stacked above, the overall configuration of the selected alignment key in the parallel direction may be the same or not be the same. For example, in the configuration of the alignment key selected in the parallel direction, the entire alignment key may be the meta key or the non-meta key. According to one or more example embodiments, in the configuration of the alignment key selected in the parallel direction, a part of the alignment key may be the meta key and the rest of the alignment key may be the non-meta key.

As such, the configuration of the alignment key 50A may be various, and infrared rays that respond effectively to the meta key and infrared rays that respond effectively to the non-meta key may be different. Accordingly, the light source configuration of the light source 30 may be determined in consideration of the vertical and/or horizontal configuration of the alignment key 50A.

According to one or more example embodiments, the light splitter 40 may be disposed to face the alignment key 50A directly. Therefore, there may be no other member between the light splitter 40 and the alignment key 50A, and accordingly, the light 30L emitted from the light source 30 toward the light splitter 40 may be reflected by the light splitter 40 and directly incident on the alignment key 50A; but it is not limited thereto. For example, as described below, further member may be provided between the light splitter 40 and the alignment key 50A according to the configuration of the light source 30, or another member may be provided between the light source 30 and the light splitter 40.

The light splitter 40 may include a beam splitter having a light reflection transmission surface in a diagonal direction. Part of the light 30L incident from the light source 30 may be transmitted by the light reflection transmission surface above, and the rest may be reflected toward the alignment key 50A. As such, the light 40L toward the alignment key 50A is reflected from the alignment key 50A and is again incident on the light splitter 40, passes through the light reflection transmission surface of the light splitter 40, and then passes through the first lens optical system 60 and the second lens optical system 70 to be incident on the photodetector 80. The first lens optical system 60 and the second lens optical system 70 may be placed between the light splitter 40 and the photodetector 80 in the y-axis direction. The first lens optical system 60 is positioned between the light splitter 40 and the second lens optical system 70. According to one or more example embodiments, the first lens optical system 60 may be an objective lens or may be provided to serve as an objective lens. According to one or more example embodiments, the first lens optical system 60 may include at least one lens or at least two lenses having different focal lengths or refractive index power. According to one or more example embodiments, the first lens optical system 60 may be the objective lens included in the existing MI optical system. According to one or more example embodiments, the second lens optical system 70 may be provided between the first lens optical system 60 and the photodetector 80. According to one or more example embodiments, the second lens optical system 70 may be located at a center between the first lens optical system 60 and the photodetector 80, and the first lens optical system 60 and the photodetector 80 located on either side of the second lens optical system 70 may be located at the focal length of the second lens optical system 70, but they are not limited thereto. According to one or more example embodiments, the second lens optical system 70 may include one lens or at least one lens that converges incident light to the opposite side.

FIG. 1 shows that the alignment key 50A is formed to protrude from the substrate 50, but the alignment key 50A may be provided in the form of a recess on the substrate 50. A plurality of patterns (e.g., first pattern 50B, second pattern 50C, and third pattern 50D) formed on the substrate 50 may exist around the alignment key 50A of the substrate 50. These first pattern 50B, second pattern 50C, and third pattern 50D may be spaced apart from the alignment key 50A. According to one or more example embodiments, all of the plurality of patterns (e.g., first pattern 50B, second pattern 50C, and third pattern 50D) may be provided on one side of the alignment key 50A. In other words, the alignment key 50A may be disposed along an edge at a side of the substrate 50. According to one or more example embodiments, a plurality of patterns (e.g., first pattern 50B, second pattern 50C, and third pattern 50D) may include wiring, a semiconductor device, a part constituting a semiconductor device, a circuit, or a part constituting a circuit.

By precisely and accurately measuring the image or the interference pattern for the alignment key 50A, it may be possible to more accurately measure the degree of overlay of the stacked material layers from the image or the interference pattern of the measured alignment key 50A. Through this measurement, it may be possible to numerically know which material layer of the stacked material layer is deviated from the alignment criterion (center); and it may be possible to numerically know in which direction and to what extent the material layer is deviated from the alignment criterion (center). Also, for a material layer whose degree of deviation, that is, the degree of overlay, or the degree of offset, deviates from the acceptance criteria (tolerance or error), the measured overlay value may be used to adjust the stacking process condition of the corresponding material layer.

Figure 2:
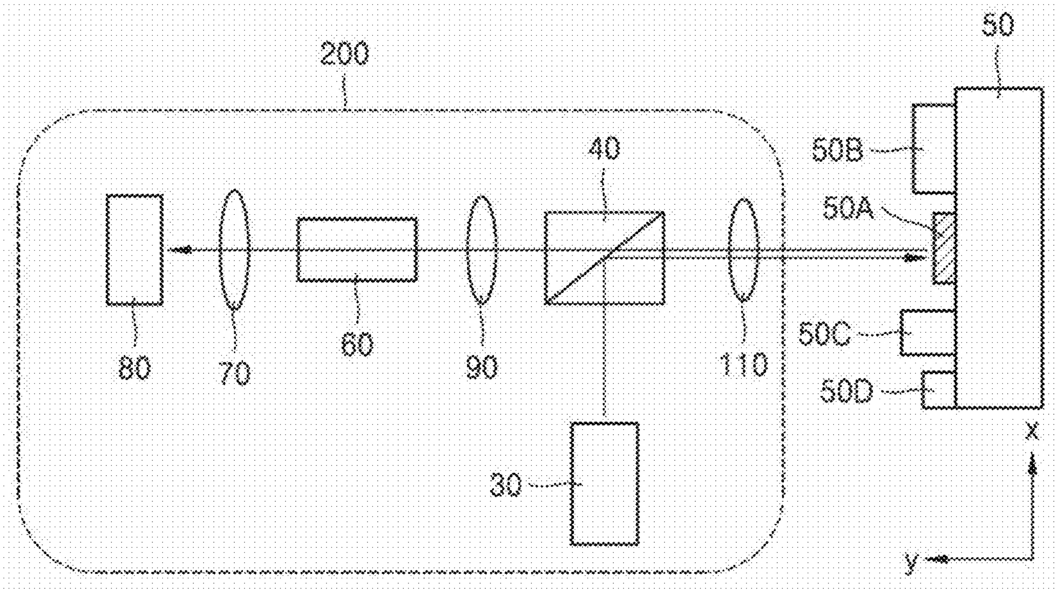
FIG. 2 is a block diagram showing a second measurement optical system for MI according to an exemplary embodiment.

FIG. 2 illustrates a second measurement optical system 200 for MI according to the one embodiment. Only aspects different from the first measurement optical system 100 of FIG. 1 will be described, and the same reference numbers as in the description of FIG. 1 indicates the same element.

Referring to FIG. 2, a third lens optical system 90 is provided between the light splitter 40 and the first lens optical system 60. The third lens optical system 90 may be positioned at a center between the light splitter 40 and the first lens optical system 60. According to one or more example embodiments, the light splitter 40 and the first lens optical system 60 on either side of the third lens optical system 90 may be located at the focal length of the third lens optical system 90. According to one or more example embodiments, the third lens optical system 90 may include one convex lens or may include at least one convex lens, but is not limited to this. As an example, since the third lens optical system 90 is comprised, the distance (interval) between the light splitter 40 and the first lens optical system 60 may increase twice as much as the focal length of the third lens optical system 90. As a result, the distance between the first lens optical system 60 and the alignment key 50*a* may also increase twice as much as the focal length of the third lens optical system 90. The fourth lens optical system 110 may be provided between the light splitter 40 and the alignment key 50*a*. The fourth lens optical system 110 may be provided to be located at the center between the light splitter 40 and the alignment key 50*a*. The light splitter 40 may be located at the focal length of the fourth lens optical system 110 but is not limited thereto. The fourth lens optical system 110 may include one convex lens or may include at least one convex lens. When measuring the image of the alignment key 50A or the interference pattern using the second measurement optical system 200, the second measurement optical system 200 may be aligned so that the alignment key 50A is located at the focal length of the fourth lens optical system 110 but is not limited thereto.

With the inclusion of the fourth lens optical system 110, the distance between the light splitter 40 and the alignment key 50A may increase twice as much as the focal length of the fourth lens optical system 110. According to one or more example embodiments, the third and/or the fourth lens optical systems 90 and 110 may be on the same optical axis.

With the provision of the third and/or fourth lens optical system 90 and 110, the distance between the light splitter 40 and the alignment key 50*a* and the interval among the first lens optical system 60 and the photodetector 80 and the alignment key 50A may also increase. As the interval increases in this way, other light components may be further provided in the area where the interval is increased.

Figure 3:
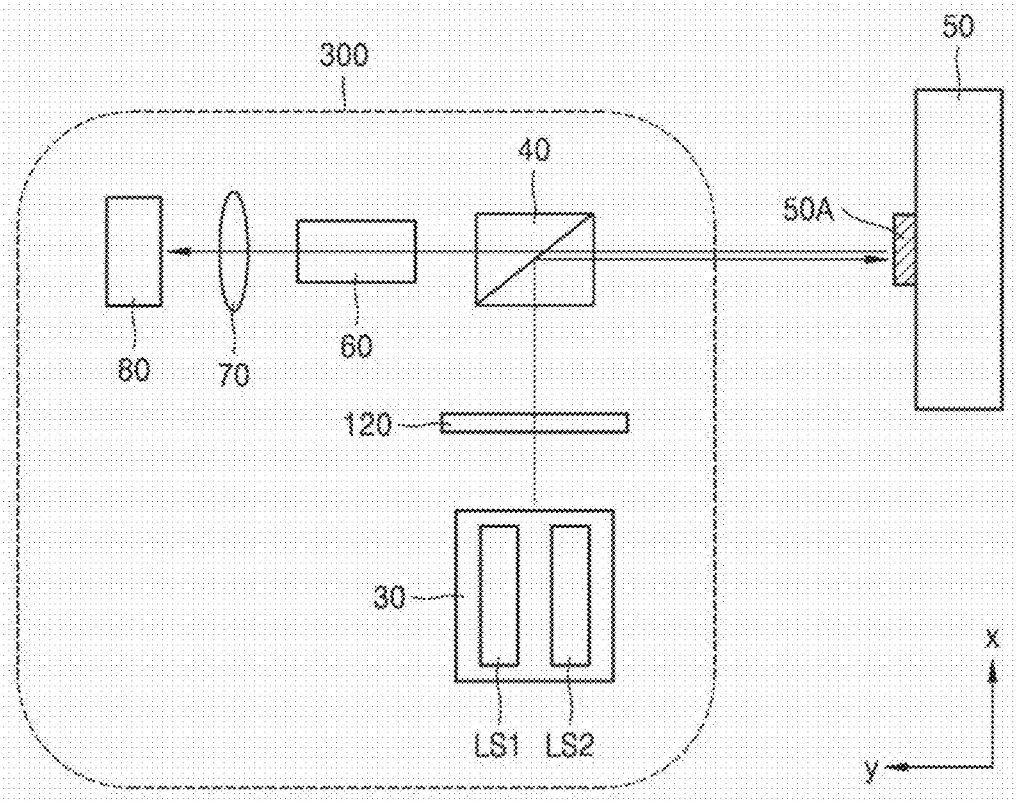
FIG. 3 is a block diagram showing a third measurement optical system according to an exemplary embodiment.

FIG. 3 shows the third measurement optical system 300 for MI according to the one exemplary embodiment. The third measurement optical system 300 may be the one that further embodies the first measurement optical system 100 of FIG. 1. Therefore, only differences from the first measurement optical system 100 will be described. In the first optical measurement optical system 100 and the third measurement optical system 300, the same reference number indicates the same member, and thus, the description thereof will be omitted.

Referring to FIG. 3, the light source 30 may include a dual light source but is not limited thereto. According to one or more example embodiments, the light source 30 may include a first light source LS1 and a second light source LS2 provided to emit light towards the light splitter 40. The first light source LS1 and the second light source LS2 may be arranged parallel to each other, but are not limited thereto. For example, only if the light emitted from the first light source LS1 and the light emitted from the second light source LS2 are directed toward the light splitter 40 and are parallel to each other, the first light source LS1 and the second light source LS2 may not be placed parallel to each other as shown in FIG. 3. As an example, one of the first light source LS1 and the second light source LS2 may be sloped or perpendicularly arranged with respect to the other. According to one or more example embodiments, the first light source LS1 and the second light source LS2 may include a light emitting device that emits light belonging to the infrared band described in the description of FIG. 1. According to one or more example embodiments, the first light source LS1 may be the laser emission device that releases the first infrared rays belonging to the SWIR or may include such a laser emission device, and the second light source LS2 may be the laser emission device that releases the second infrared rays being different from the first infrared rays and belonging to the SWIR or may include such a laser emission device. According to one or more example embodiments, the wavelengths of the one of the first and the second infrared rays may range from 1000 nm to 1100 nm, from 1030 nm to 1080 nm or about 1050 nm, and the wavelengths of the other may range from 1100 nm to 1300 nm, from 1150 nm to 1200 nm or about 1180 nm, which are not limited to thereto. According to one or more example embodiments, at least some of the patterns that make up the alignment key 50A may include meta keys. According to one or more example embodiments, the alignment key 50A may include a meta key and a non-meta key together. Infrared ray having the wavelength ranging from 1000 nm to 1100 nm of the first and second infrared rays may be used for obtaining an image or an interference pattern for non-meta key among the patterns constituting the alignment key 50A. It may be possible to obtain the image or the interference pattern of non-meta key among the patterns constituting the alignment key 50A by emitting infrared rays having a wavelength ranging from 1000 nm to 1100 nm, for example infrared rays having a wavelength of 1050 nm, to the alignment key 50A, and it may be possible to measure the degree of overlay of the non-meta key by way of such image or interference pattern. Since the material layer formed with the alignment key 50A is formed along with the alignment key 50A, the degree of overlay measured through the alignment key 50A may be the degree of overlay of the material layer formed with the alignment key 50A.

When the degree of overlay of non-meta key among the patterns constituting the alignment key 50A is more than 300 nm, it may be possible to measure the degree of overlay of the non-meta key by emitting infrared rays having a wavelength ranging from 1000 nm to 1100 nm to the alignment key 50A. When measuring overlays of 300 nm or more, it can be said that the overlay is measured with the macro-overlay measurement or the macro precision, and when measuring overlays of 100 nm or less, it can be said that the overlay is measured with the micro-overlay measurement or the micro precision.

Infrared ray having a wavelength ranging from 1100 nm to 1300 nm of the first and second infrared rays may be radiated onto the alignment key 50A so as to obtain the image or the interference pattern with respect to the meta key among the patterns constituting the alignment key 50A. It may be possible to obtain the image or the interference pattern of the meta key of the patterns constituting the alignment key 50A by radiating infrared ray having a wavelength ranging from 1100 nm to 1300 nm, for example a wavelength with 1180 nm to the alignment key 50A, and it may be possible to measure the degree of overlay of the meta key through such image or interference pattern. The method of measuring the degree of overlay by radiating the infrared ray to the meta key may be used when measuring an overlay of micro-level, i.e., overlay of 100 nm or less, for example, overlay of 90 nm or less, 80 nm or less, or 50 nm or less.

As a result, it may be possible to measure the overlay of macro-level, by radiating infrared ray having a wavelength ranging from 1000 nm to 1100 nm to non-meta key of the alignment key 50A using the third measurement optical system 300 and then radiating infrared ray having a wavelength ranging from 1100 nm to 1300 nm to the meta key of the alignment key 50A; here, the order of the measurement may be changed. In other words, it may be possible to measure the macro-level overlay and the micro-level overlay together using the third measurement optical system 300, so that it would be possible to analyze the semiconductor manufacturing process in a more detailed manner and to control each of the process conditions of the semiconductor manufacturing in a more precise manner. Accordingly, it may be possible to increase the stability of the manufacturing process due to the increase in the degree of integration of the semiconductor device, and to lead to the increase in the yield of the semiconductor device.

According to one or more example embodiments, each of the first light source LS1 and the second light source LS2 may be an active-type light source capable of varying wavelength emitted therefrom. According to one or more example embodiments, the light source 30 may include a control unit or a wavelength selection unit that generates a control signal for controlling (selecting) wavelengths emitted from the first light source LS1 and the second light source LS2. According to one or more example embodiments, the above control unit or the wavelength selection unit may be provided outside the light source 30; for example, a control signal generator may be included, which generates the control signal in a control unit or a circuit prepared for overseeing entire operation of the third measurement optical system 300 and applies it to the light source 30.

A wavelength filter 120 may be provided between the light source 30 and the light splitter 40, which passes the light of a specific wavelength emitted from the light source 30, and blocks the rest of the light. The wavelength filter 120 may be expressed as a wavelength selection filter or a wavelength selection unit. According to one or more example embodiments, the wavelength filter 120 may be an active-type filter, and when the non-meta key of the alignment key 50A is irradiated with infrared rays, the wavelength filter 120 may be operated to pass a wavelength between 1000 nm and 1100 nm (e.g., a wavelength of 1050 nm) in light emitted from the light source 30, and block the rest. When the meta key of the alignment key 50A is irradiated with infrared rays, the wavelength filter 120 may be operated to pass wavelengths between 1100 nm and 1300 nm (e.g., 1180 nm) from the light emitted from the light source 30 and block the rest.

According to one or more example embodiments, as described above, when the first light source LS1 and the second light source LS2 are the active type light sources of a wavelength variable type, each of the first light source LS1 and the second light source LS2 may emit light of a specified wavelength, and thus, the wavelength filter 120 may be omitted.

The light source 30 and the wavelength filter 120 of the third measurement optical system 300 may replace the light source 30 of the second measurement optical system 200 of FIG. 2.

Figure 4:
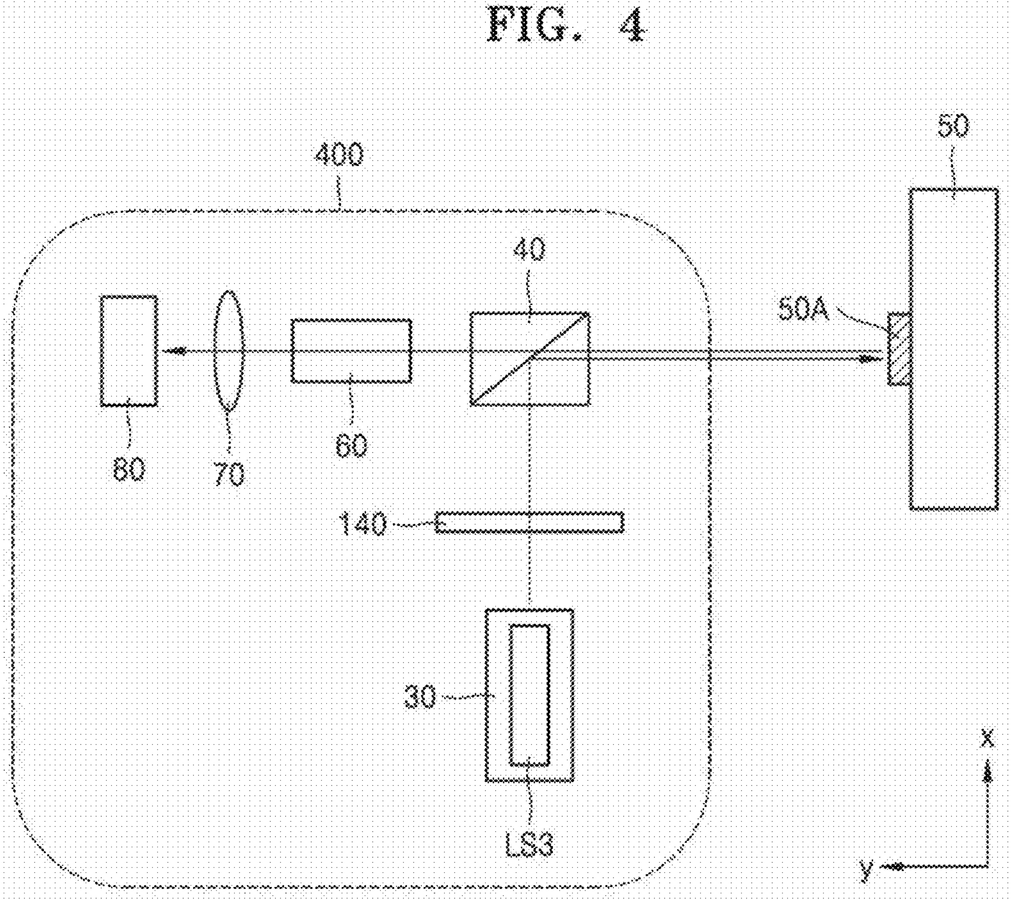
FIG. 4 is a block diagram showing a fourth measurement optical system according to an exemplary embodiment.

FIG. 4 illustrates a fourth measurement optical system 400 for MI according to an exemplary embodiment. The fourth measurement optical system 400 may also be a more specific example of the first measurement optical system 100 of FIG. 1. Only parts different from those of the first measurement optical system 100 will be described. The same reference numerals used in the first measurement optical system 100 and the fourth measurement optical system 400 denote the same members, and a description thereof will be omitted.

The light source 30 is a single light source and may include a third light source LS3. The third light source LS3 may be a light source that emits light in the infrared band described in FIG. 1, for example, a light source that emits laser light but is not limited thereto. According to one or more example embodiments, the third light source LS3 may emit unpolarized light. A polarization filter 140 may be provided between the light source 30 and the light splitter 40. Light emitted from the light source 30 may be incident on the light splitter 40 through the polarization filter 140. According to one or more example embodiments, the polarization filter 140 may serve as a vertical polarization filter that passes only vertical polarization or a horizontal polarization filter that passes only horizontal polarization. According to one or more example embodiments, the polarization filter 140 may be an active polarization filter that can electrically operate and arbitrarily change the polarization state or the polarization filter may include such an active polarization filter. Therefore, when it is needed to irradiate the alignment key 50A with a specific polarization, the polarization filter 140 may operate to allow only the light with the specific polarization emitted from the light source 30 to pass and to block the remaining light. According to one or more example embodiments, the above specific polarization may be vertical polarization or horizontal polarization.

According to one or more example embodiments, the alignment key 50A may include a key responding to the vertical polarization and a key responding to the horizontal polarization. Therefore, when the horizontal polarization is incident on the alignment key 50A, since the key responding to the horizontal polarization reacts like a meta key, and the key responding to the vertical polarization reacts like a non-meta key, the micro-level overlay can be measured through the key responding to the horizontal polarization, and at the same time, the macro-level overlay can be measured through the key responding to the vertical polarization.

When the vertical polarization is incident on the alignment key 50A, since the key responding to the vertical polarization reacts like the meta key, and the key responding to the horizontal polarization reacts like the non-meta key, the micro-level overlay can be measured through the key responding to the vertical polarization, and the macro-level overlay can be measured through the key responding to the horizontal polarization at once.

Figure 5:
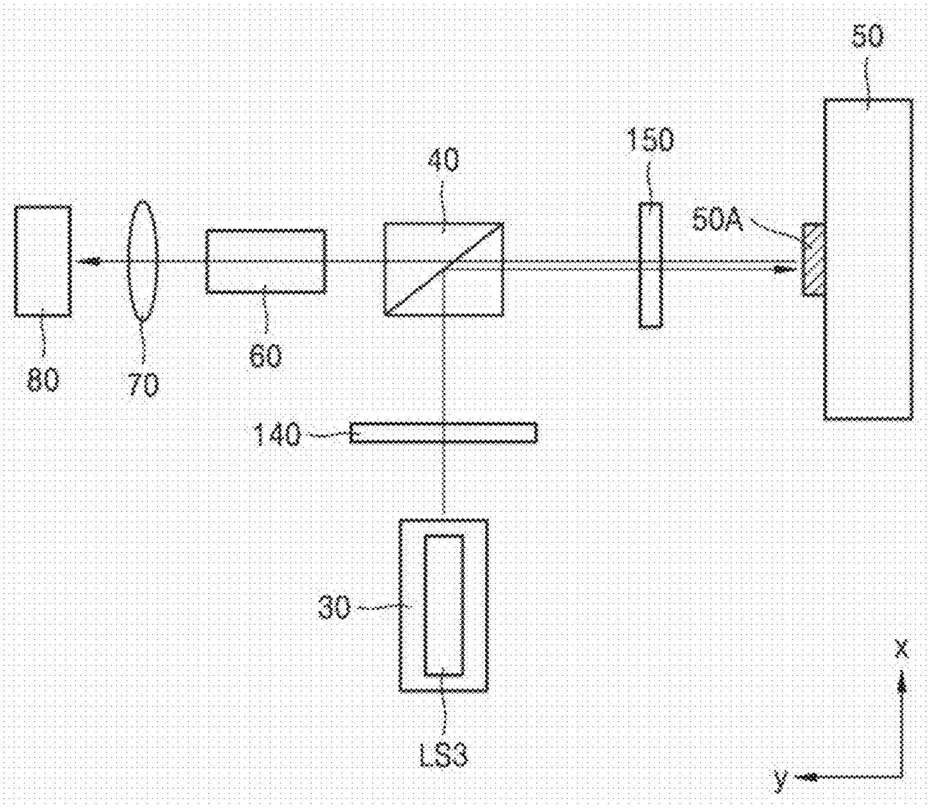
FIG. 5 is a polarization controller that is further included between a light splitter and an alignment key as shown in FIG. 4.

According to one or more example embodiments, as shown in FIG. 5, a polarization controller 150 may be optionally provided between the light splitter 40 and the alignment key 50A. The polarization controller 150 may be used to adjust the polarization state of light incident on the alignment key 50A.

Figure 6:
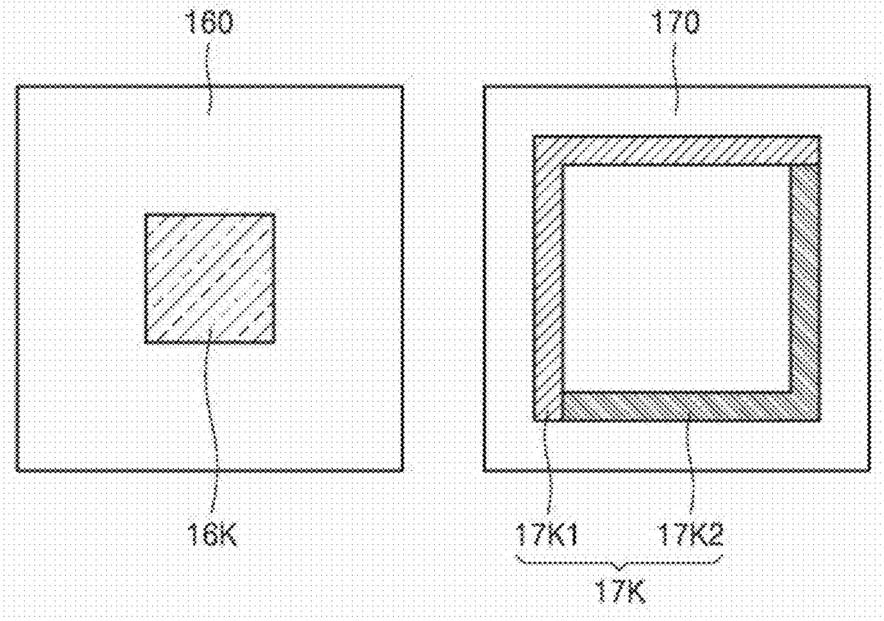
FIG. 6 is a plan view showing each of two alignment keys, wherein two alignment keys, which are the object of overlay measurement using the measurement optical system as shown in FIG. 1, FIG. 2, FIG. 3, FIG. 4, and FIG. 5, are stacked.

FIG. 6 shows an example of a case in which two alignment keys stacked are included, wherein the alignment keys are the object of the overlay measurement using the first measurement optical system 100, the second measurement optical system 200, the third measurement optical system 300, and the fourth measurement optical system 400 shown in FIG. 1, FIG. 2, FIG. 3, FIG. 4, and FIG. 5.

In FIG. 6, the left side represents the first alignment key 16K formed in a partial area of the first substrate 160, and the right side represents the second alignment key 17K formed in a partial area of the second substrate 170. According to one or more example embodiments, the first substrate 160 may be a first wafer or a first material layer. According to one or more example embodiments, the second substrate 170 may be a second wafer which will be bonded to the first wafer or a second material layer which will be stacked on the first material layer.

Referring to FIG. 6, According to one or more example embodiments, the first alignment key 16K may have a rectangular (e.g., square) planar shape, but it is not limited thereto. According to one or more example embodiments, the first alignment key 16K may be a meta key or a non-meta key. The first alignment key 16K is shown to be formed at a center of the first substrate 160, but it may be formed at any location of the first substrate 160. The second alignment key 17K may be formed corresponding to the first alignment key 16K, and its planar shape may be a rectangular (e.g., square) strip shape that completely surrounds the first alignment key 16K. According to one or more example embodiments, the second alignment key 17K may include a first sub-key 17K1 and a second sub-key 17K2. The first sub-key 17K1 forms two sides of the second alignment key 17K, which are perpendicular and adjacent to each other, and the second sub-key 17K2 forms two sides of the second alignment key 17K, which are perpendicular and adjacent to each other. Either end of the first sub-key 17K1 may be in contact with or connected to either end of the second sub-key 17K2, but they may be spaced apart from each other. The first sub-key 17K1 and the second sub-key 17K2 may be all meta keys; otherwise, one of which may be a meta key, and the rest may be a non-meta key. According to one or more example embodiments, at least one of the first alignment key 16K and the second alignment key 17K may be a meta key.

Figure 7:
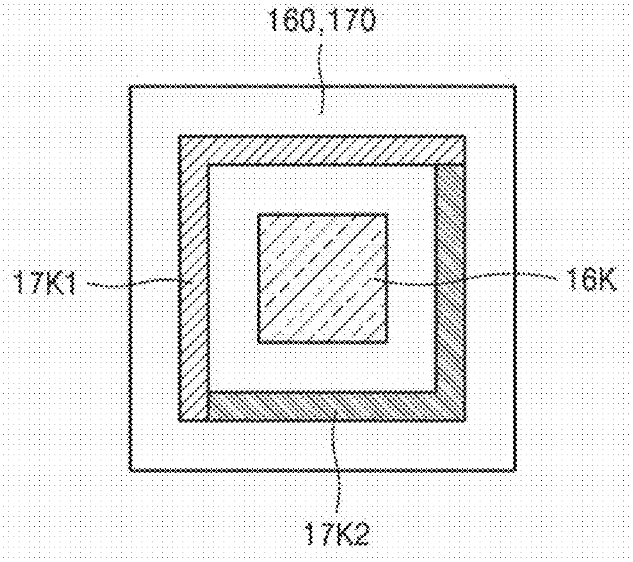
FIG. 7 is a plan view showing a case in which a first and a second substrates shown in FIG. 6 are stacked or bonded to each other through the alignment of the alignment key.

FIG. 7 is the plan view illustrating a case where the first substrate 160 and the second substrate 170 of FIG. 6 are stacked or bonded to each other through alignment by way of the alignment keys 16K and 17K.

Referring to FIG. 7, the first alignment key 16K is positioned at an inner center of the second alignment key 17K on a plane. The interval of the first alignment key 16K and the second alignment key 17K may be constant in every direction. The degree of alignment of the first alignment key 16K and the second alignment key 17K, i.e., the degree of overlay, may be measured by measuring images or interference patterns for the first alignment key 16K and the second alignment key 17K by irradiating the first alignment key 16K and the second alignment key 17K with infrared rays as described above. According to one or more example embodiments, when the first sub-key 17K1 of the second alignment key 17K is the meta key and the second sub-key 17K2 is the non-meta key, it is possible to measure a micro-level overlay by irradiating the first sub-key 17K1 with infrared rays having a wavelength of 1100 nm to 1300 nm, and to measure the overlay of the macro level by irradiating the second sub-key 17K2 with infrared rays having a wavelength of 1000 nm to 1100 nm.

Figure 8:
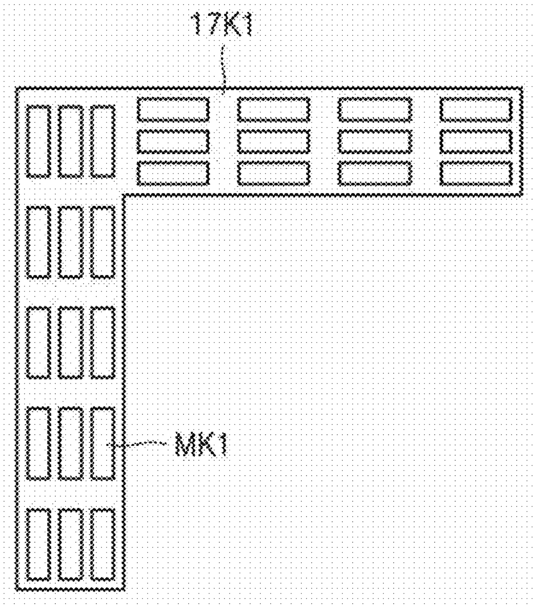
FIG. 8 shows a case in which a first sub key of FIG. 6 and FIG. 7 includes a meta-key.

FIG. 8 illustrates a case where the first sub-key 17K1 of FIG. 6 and FIG. 7 includes a meta key MK1.

Referring to FIG. 8, the first sub-key 17K1 includes a plurality of meta keys MK1 aligned in vertical and horizontal directions. The meta key MK1 is a meta pattern, and its specifications (e.g., pitch, width, height, etc.) may be smaller than the wavelength of incident light, for example, less than or equal to the ½ of the wavelength of incident light. According to one or more example embodiments, the specifications of each of a plurality of meta keys MK1 may be the same, but they may not be the same. According to one or more example embodiments, when the specification of the meta key MK1 is changed, the overlay of the macro level may also be measured by the meta key MK1.

Figure 9:
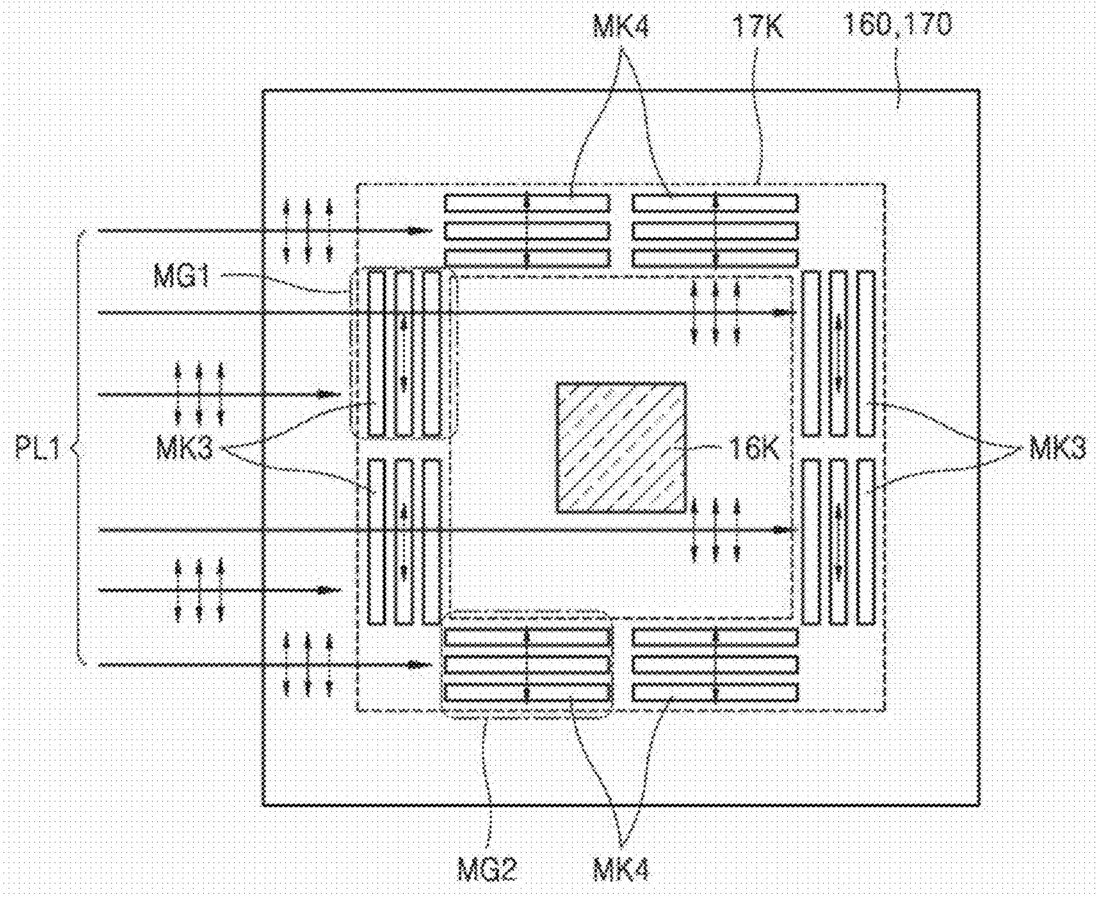
FIG. 9 shows a case in which the second alignment key of FIG. 7 includes a third sub-key responding to vertical polarization and a fourth sub-key responding to horizontal polarization.

FIG. 9 shows a case where the second alignment key 17K of FIG. 7 includes a third sub-key MK3 responding to the vertical polarization and a fourth sub-key MK4 responding to the horizontal polarization.

Referring to FIG. 9, the third sub-key MK3 is a plurality of meta patterns vertically aligned, and the fourth sub-key MK4 is a plurality of meta patterns horizontally aligned. Each meta pattern of the third sub-key MK3 has a length in the vertical direction, and each meta pattern of the fourth sub-key MK4 has a length in the horizontal direction. The third sub-key MK3 may include a plurality of first meta pattern groups MG1 spaced apart from each other, and each of the first meta pattern groups MG1 may include a plurality of meta patterns having the same specifications. The fourth sub-key MK4 may include a plurality of second meta pattern groups MG2 spaced apart from each other, and each of the second meta pattern groups MG2 may include a plurality of meta patterns having the same specifications.

Since the third sub-key MK3 includes a plurality of meta-key aligned in a vertical direction, when the infrared light PL1 of vertical polarization is incident, the third sub-key MK3 may act like a meta-key with respect to the incident light PL1 to enable micro-level overlay measurement. However, since the fourth sub-key MK4 includes a meta key aligned horizontally, and it acts like a non-meta key with respect to the incident light PL1 of vertical polarization, it may be possible to measure the macro-level overlay through the fourth sub-key MK4. In other words, when the infrared light PL1 of vertical polarization is incident, it may be possible to measure the micro-level overlay in the horizontal direction, and to measure the macro-level overlay in the vertical direction.

Figure 10:
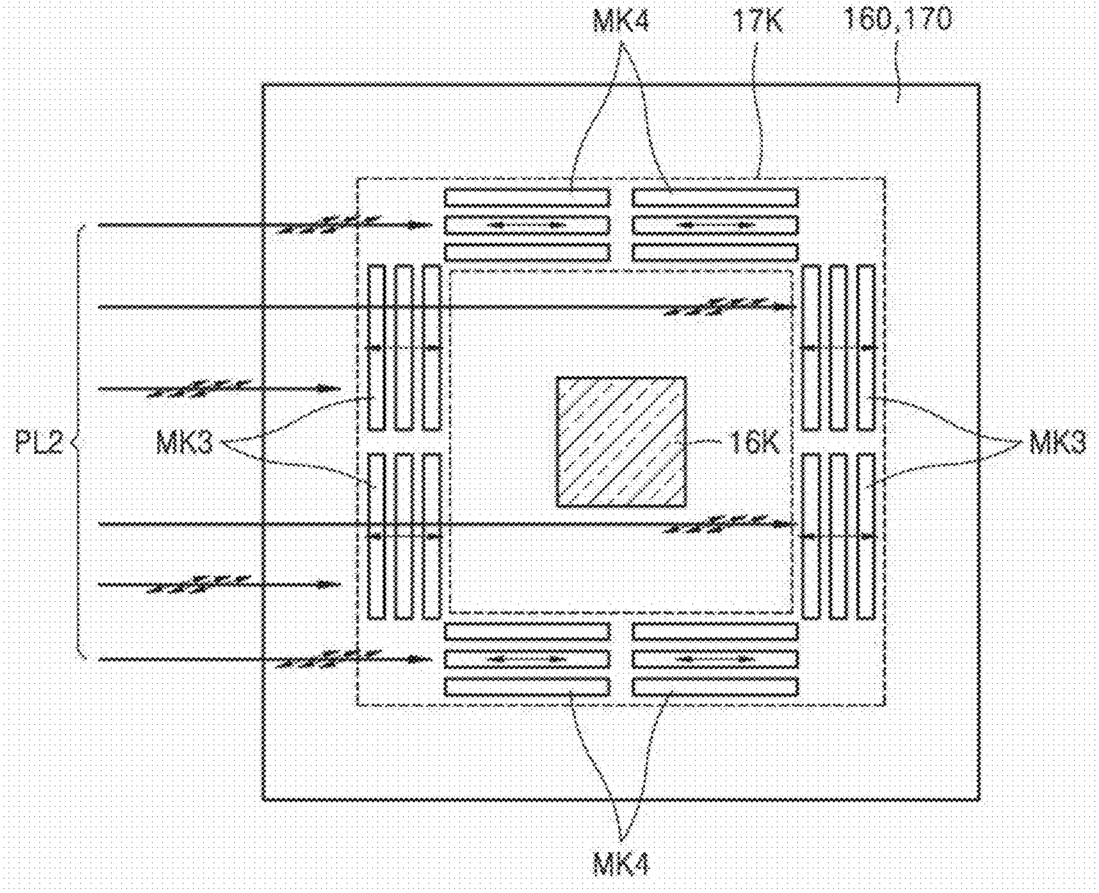
FIG. 10 shows a case in which infrared rays of horizontal polarization, instead of vertical polarization as in FIG. 9, are incident on an alignment key in a direction perpendicular to the ground.

As shown in FIG. 10, when the infrared light PL2 of horizontal polarization is incident on the alignment keys 16K and 17K in a direction perpendicular to the ground, the third sub-key MK3 acts like a non-meta-key with respect to the incident light PL2, so that it may be possible to measure the overlay of the macro level through the third sub-key MK3; and since the fourth sub-key MK4 includes the meta-key aligned in a horizontal direction, and it acts like a meta-key with respect to the incident light PL2 of horizontal polarization, it may be possible to measure the overlay of micro-level through the fourth sub-key MK4. In other words, when the infrared light PL2 of horizontal polarization is incident, it may be possible to measure the overlay of macro-level in the horizontal direction, and to measure the overlay of micro-level in the vertical direction.

Figure 11:
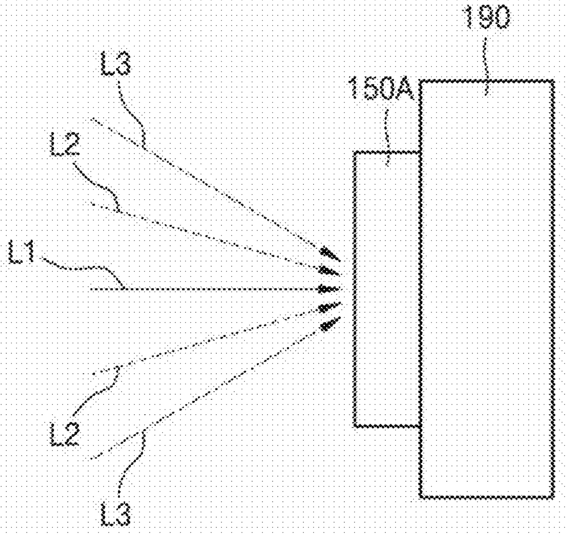
FIG. 11 is a cross-sectional view exemplarily illustrating a case in which light from the measurement optical system illustrated in FIG. 1, FIG. 2, FIG. 3, FIG. 4.

FIG. 11 exemplarily shows a case in which light is obliquely incident on the alignment key 150A formed on the substrate 190 from the first measurement optical system 100, the second measurement optical system 200, the third measurement optical system 300, and the fourth measurement optical system 400 illustrated in FIG. 1, FIG. 2, FIG. 3, FIG. 4, and FIG. 5.

In FIG. 11, reference numeral L1 denotes the first light vertically incident on the alignment key 150A from the first measurement optical system 100, the second measurement optical system 200, the third measurement optical system 300, and the fourth measurement optical system 400. Reference numeral L2 denotes the second light obliquely incident on the alignment key 150A from the first measurement optical system 100, the second measurement optical system 200, the third measurement optical system 300, and the fourth measurement optical system 400 at a first angle. Reference numeral L3 denotes the third light obliquely incident on the alignment key 150A from the first measurement optical system 100, the second measurement optical system 200, the third measurement optical system 300, and the fourth measurement optical system 400 at a second angle. For convenience of illustration, the first light L1, the second light L2, and the third L3 are shown to converge on the alignment key 150A, but each of the first light L1, the second light L2, and the third light L3 may be the light that is incident on the alignment key 150A as a whole. According to one or more example embodiments, the alignment key 150A may be one of the alignment keys 50A and 16K+17K described above, or may be an alignment key whose configurations of the meta key and the non-meta key are different from those described above. The substrate 190 may include two bonded wafers or a material layer stacked in multiple layers.

The second light L2 and the third light L3 obliquely incident on the alignment key 150A may be implemented by rotating the light splitter 40 of the first measurement optical system 100, the second measurement optical system 200, the third measurement optical system 300, and the fourth measurement optical system 400 on one axis within a given range; otherwise, it may be implemented by changing the angle of incidence of light incident from the light source 30 to the light splitter 40 or by tilting the substrate 190 itself.

When the light is obliquely incident on the alignment key 150A, the pitch of the meta pattern formed on the alignment key may look different according to the angle of oblique incidence.

Figures 12A, 12B, 12C:
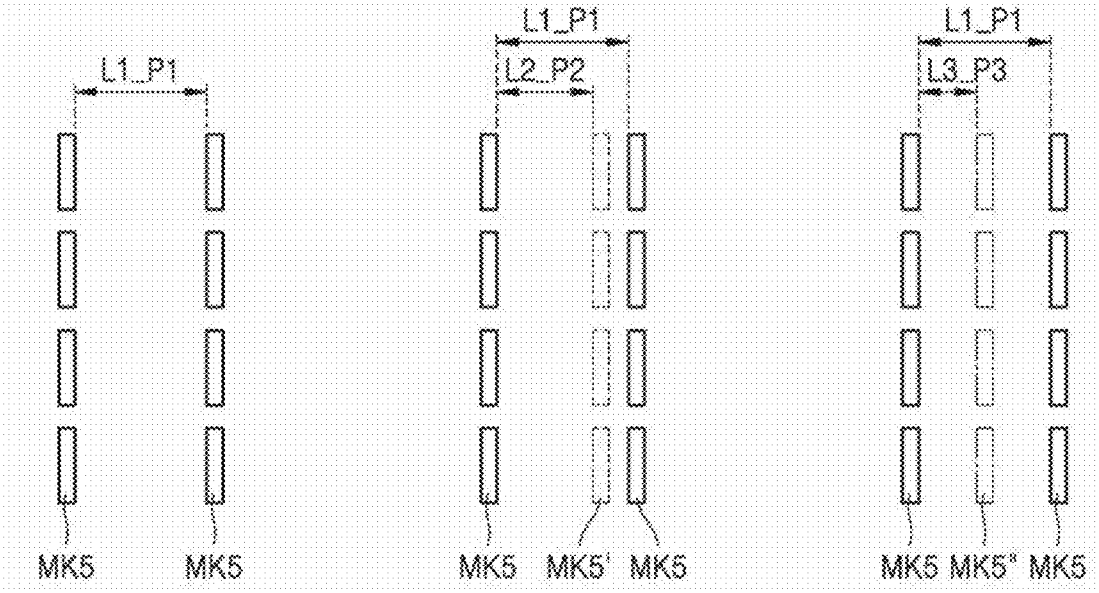
FIG. 12A, FIG. 12B and FIG. 12C are plan views exemplarily showing that the pitch of the meta pattern formed on the alignment key looks different according to an obliquely incident angle when light is obliquely incident on the alignment key.

FIG. 12A, FIG. 12B, and FIG. 12C show the one example in connection with the above description. In FIG. 12A, FIG. 12B, and FIG. 12C, reference numeral MK5 indicates a plurality of meta keys (meta patterns) included in the alignment key 150A. A plurality of the meta keys MK5 may be provided to form meta line grating.

A plurality of the meta keys MK5 are aligned to have a first pitch L1_P1 in the horizontal direction.

FIG. 12A illustrates the horizontal pitch of the meta key MK5, which is shown when the light is incident on the alignment key 150A, i. e., when the first light L1 is incident on the alignment key 150A. Referring to FIG. 12A, the horizontal pitch of the meta key MK5 is the first pitch L1_P1, which is the same as the actual horizontal pitch of the meta key MK5.

Referring to FIG. 12B, the horizontal pitch of the meta key MK5 is shown, which appears when the second light L2 is obliquely incident on the alignment key 150A at a first angle. Referring to FIG. 12B, when the second light L2 is incident on the alignment key 150A, the horizontal pitch of the meta key MK5 is shown as a second pitch L2_P2. The second pitch L2_P2 is smaller than the first pitch L1_P1.

Referring to FIG. 12C, the horizontal pitch of the meta key MK5 is shown when the third light L3 incident at the second angle is incident on the alignment key 150A. Referring to FIG. 12(*c*), when the third light L2 is incident on the alignment key 150A, the horizontal pitch of the meta key MK5 appears as the third pitch L3_P3. The third pitch L3_P3 is smaller than the second pitch L2_P2.

Comparing FIG. 12A, FIG. 12B and FIG. 12C to one another, as the obliquely incident angle of light incident on the alignment key 150A with respect to the vertically incident first light L1 increases, the horizontal pitch of the meta key MK5 of the alignment key 150A appears to be gradually smaller. As such, since the change in the horizontal pitch of the meta key MK5 of the alignment key 150A may affect the intensity and the direction of the reflected light reflected from the alignment key 150A, the change in the horizontal pitch of the meta key MK5 may affect the contrast of the image of the alignment key 150A. For example, if the horizontal pitch of the meta key MK5 of the alignment key 150A is changed, the contrast of the image of the alignment key 150A may increase or decrease.

Figure 13A:
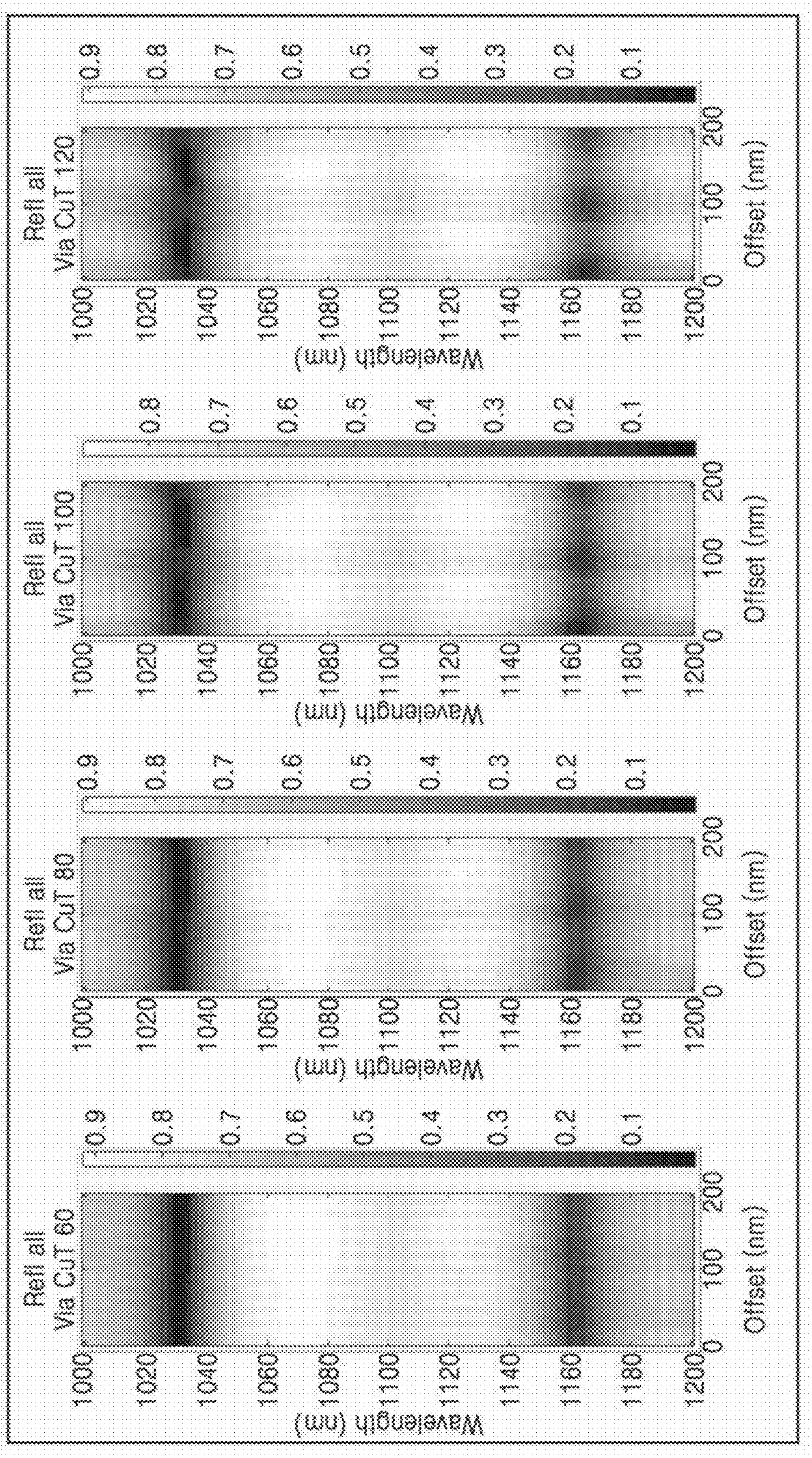
FIG. 13A shows the change in the intensity of light detected by the photodetector, when measuring the offset (overlay) with a reflective measurement optical system for MI according to an exemplary embodiment.
Figure 13B:
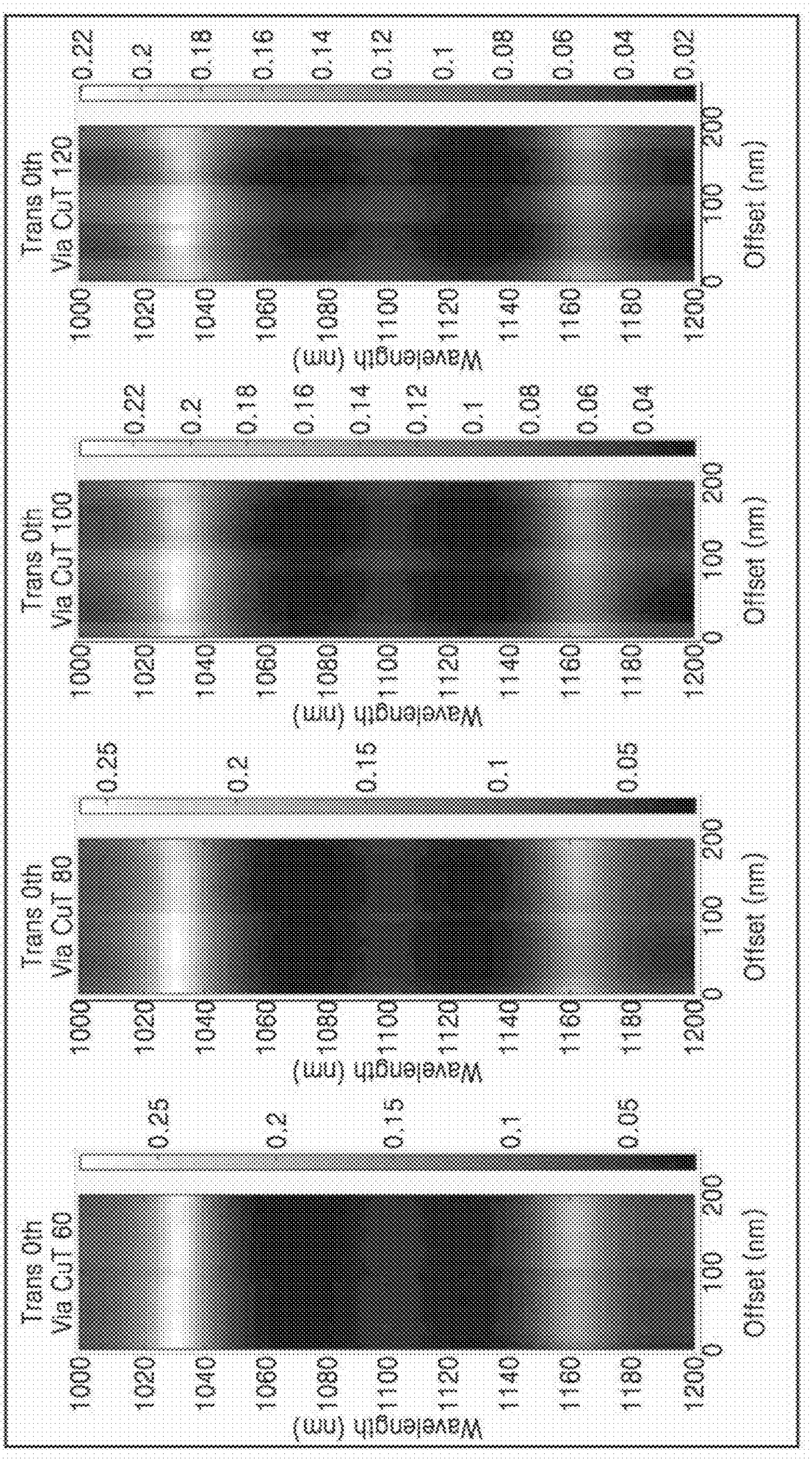
FIG. 13B shows a change in the intensity of light detected by the photodetector when measuring the offset (overlay) with an existing transmission type measurement optical system for MI.

FIG. 13A shows a change in the intensity of light detected in a photodetector when measuring offset (overlay) with a reflective measurement optical system for MI (hereinafter referred to as a first optical system) according to the one exemplary embodiment, and FIG. 13B shows a change in the intensity of light detected in the photodetector, when measuring offset (overlay) with a related art transmissive measurement optical system for MI (a second optical system).

In FIG. 13A and FIG. 13B, the horizontal axis represents the offset, the left vertical axis represents the wavelength of light incident on the alignment key, and the right vertical axis represents the intensity of light incident on the photodetector. As the value of the right vertical axis increases, the intensity of light incident on the photodetector increases.

FIG. 13A illustrates the result measured by the first optical system, and FIG. 13B illustrates the result measured by the second optical system. In FIG. 13A and FIG. 13B, the results are shown, wherein the first result from the left shows that the thickness of the material layer formed with the alignment key is 60 μm, the second result from the left shows that the thickness is 80 μm, the third result from the left shows that the thickness is 100 μm, and the fourth result from the left shows that the thickness of the material layer is 120 μm.

Comparing FIG. 13A to FIG. 13B, both the first and the second optical systems show an offset at the same wavelength, however, it can be seen from the value of the right vertical axis that the intensity of the light detected by the photodetector is much greater in the first optical system than in the second optical system at all thickness. For example, when the thickness of the material layer is 60 μm and the wavelength of light incident on the alignment key is 1020 nm, the intensity of light detected by the photodetector of the first optical system is about 0.8, while the intensity of light detected by the photodetector of the second optical system is about 0.25, and thus, the intensity of light detected by the photodetector of the first optical system is three times or more than that of the second optical system. The intensity of light detected by the photodetectors of the first and the second optical systems may differ by tens of times, depending on the thickness of the material layer and the wavelength of incident light.

These results suggest that a clearer and brighter image for MI may be obtained when measuring images for alignment keys using the illustrated reflective measurement optical system for MI.

Figure 14A:
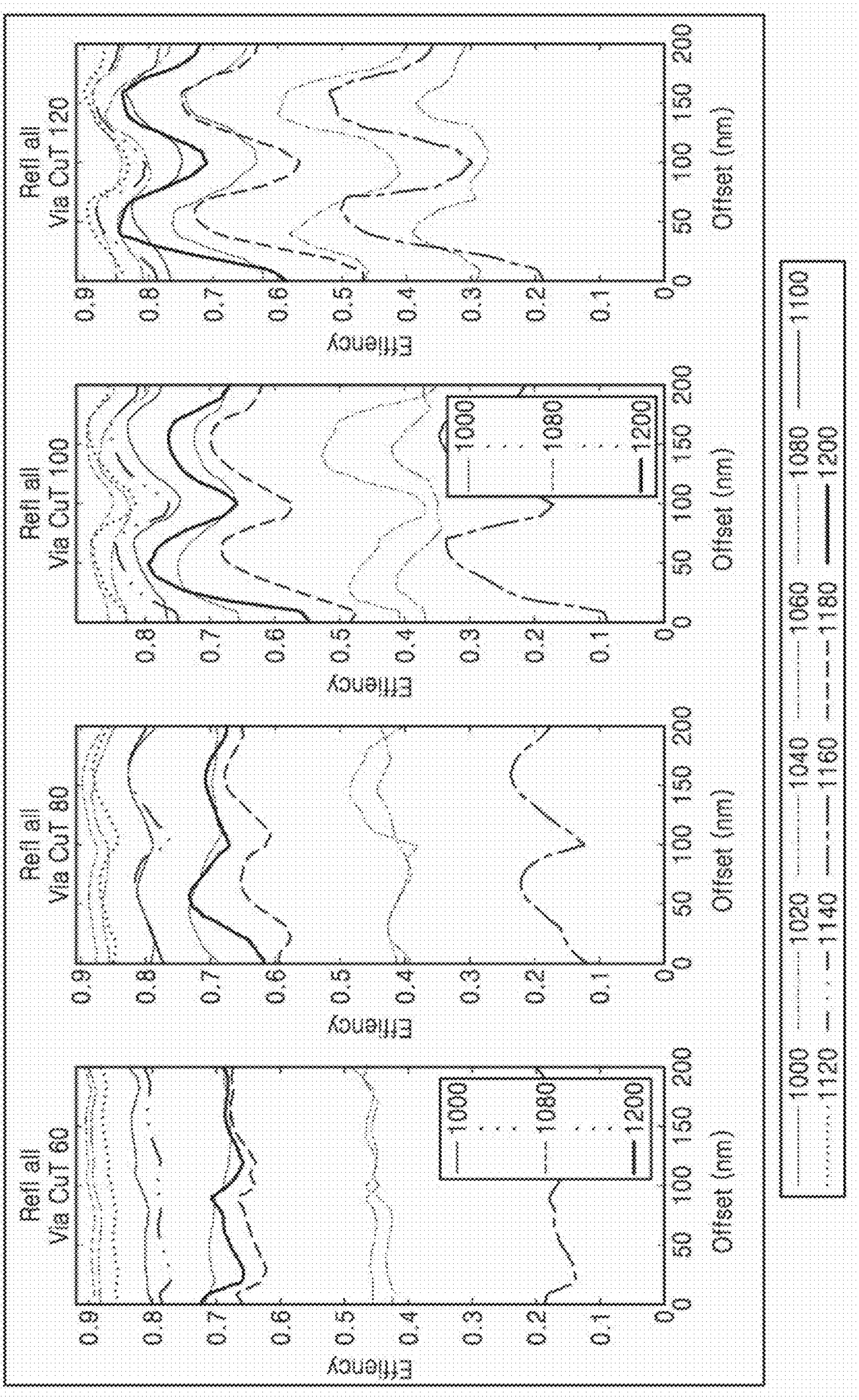
FIG. 14A is a graph showing the result corresponding to FIG. 13A.
Figure 14B:
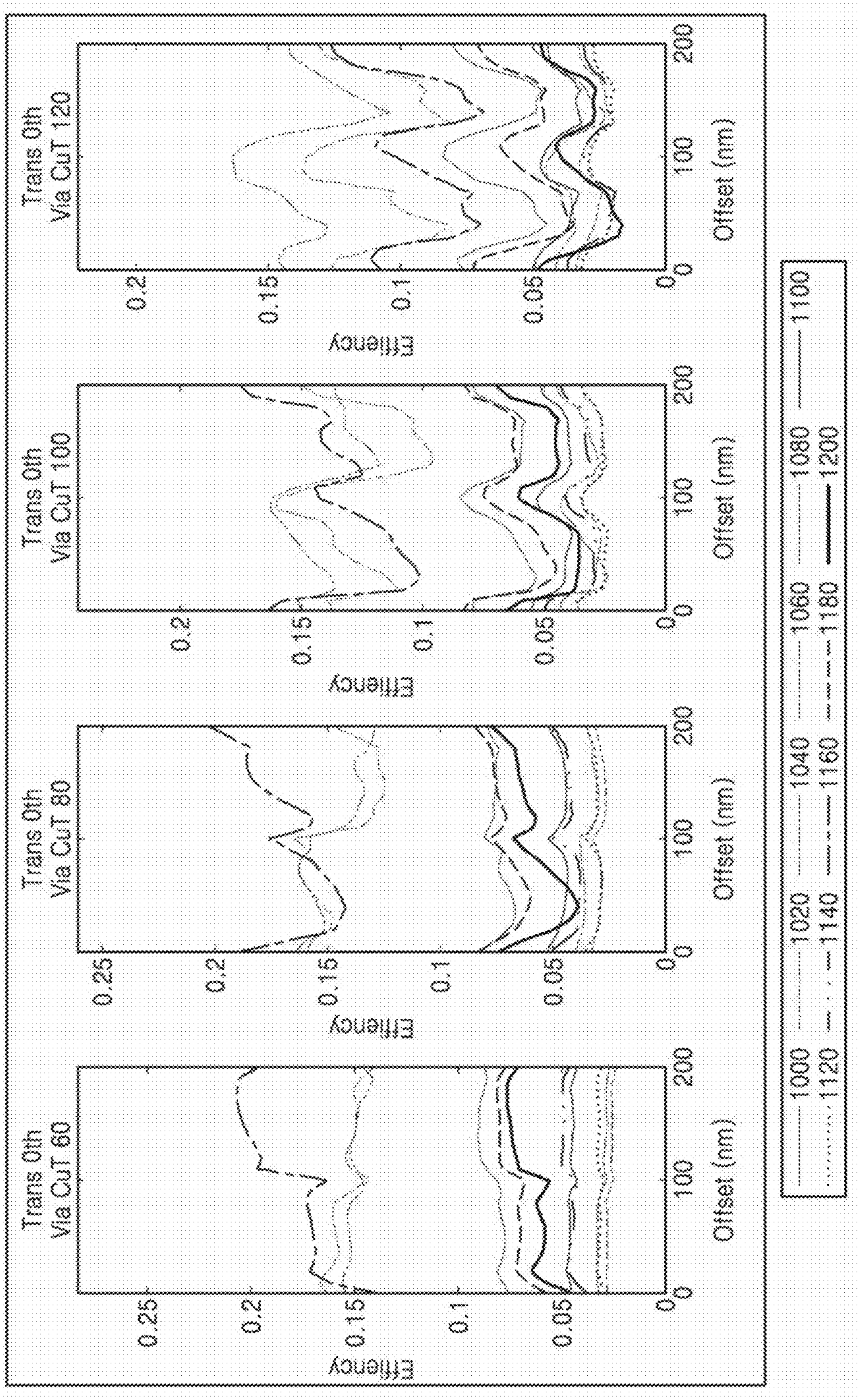
FIG. 14B is a graph showing a result corresponding to FIG. 13B.

FIG. 14 shows the result of FIG. 13 in a graphic manner. FIG. 14A relates to the first optical system, and FIG. 14B relates to the second optical system. In FIG. 14A and FIG. 14B, the horizontal axis represents the offset, and the vertical axis represents the intensity of light detected by the photodetector. Comparing FIG. 14A to FIG. 14B, it may be seen that, similar to FIG. 13, the intensity of light incident on the photodetector of the first optical system is much greater than that of the second optical system in every wavelength and every thickness of the material layer.

The disclosed measurement optical system for MI is a reflective-type measurement optical system that radiates infrared rays to alignment keys containing a meta key, and measures an overlay by measuring light (image or interference pattern) reflected from the alignment key, wherein the intensity of light detected in the photodetector increases compared to a related art transmission-type optical system. Further, since the disclosed optical system targets an alignment key containing a meta key, the micro-level overlay measurement may be possible based on the meta key, and at the same time the macro-level overlay measurement may be also possible based on a non-meta key. In other words, even the microscopic overlay (micro-level overlay) that could not be measured by related art optical systems can be measured using the disclosed measurement optical system, along with the macro-level overlay, and thus, it may be helpful to improve yield, while increasing reliability of a process in which a highly integrated semiconductor device is manufactured.

Although many matters are specifically described in the above description, they should be interpreted as examples of embodiments rather than limiting the scope of the present disclosure. Therefore, the scope of the present disclosure should not be defined by the embodiments in the description, but by the technical idea described in the scope of the claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A measurement optical system comprising:

a light source configured to emit infrared light;

a light splitter configured to reflect, from the light source and to a subject, a first portion of the infrared light incident to the light splitter;

a photodetector on a same optical axis as the light splitter and configured to receive a second portion of the infrared light reflected from the subject;

a first lens optical system between the light splitter and the photodetector; and a second lens optical system between the first lens optical system and the photodetector, wherein the subject comprises an alignment key on which a meta key is provided, wherein the measurement optical system is configured to measure a first overlay by irradiating the alignment key and to measure a second overlay by irradiating the alignment key, wherein one of the measuring the first overlay and the measuring the second overlay comprises measuring an overlay of stacked substrates of the subject and of 300 nm or more, and wherein the other one of the measuring the first overlay and the measuring the second overlay comprises measuring an overlay of the stacked substrates of the subject and of 100 nm or less.

2. The measurement optical system of claim 1, wherein the light source comprises a wavelength variable light source.

3. The measurement optical system of claim 2, wherein the light source comprises:

a first light source configured to emit first infrared light; and a second light source configured to emit a second infrared light having a wavelength that is different from a wavelength of the first infrared light.

4. The measurement optical system of claim 1, wherein the light source comprises:

a first light source emitting configured to emit first infrared light; and a second light source configured to emit a second infrared light having a wavelength that is different from a wavelength of the first infrared light.

5. The measurement optical system of claim 4, further comprising a wavelength filter between the light source and the light splitter.

6. The measurement optical system of claim 1, further comprising a third lens optical system between the light splitter and the first lens optical system.

7. The measurement optical system of claim 6, further comprising a fourth lens optical system disposed between the light splitter and the subject.

8. The measurement optical system of claim 1, further comprising a polarization filter between the light source and the light splitter.

9. The measurement optical system of claim 1, wherein the light source is further configured to emit the infrared light to the light splitter such that the first portion of the infrared light reflected from the light splitter is further obliquely incident on the subject.

10. The measurement optical system of claim 1, wherein the meta key comprises:

a first meta key configured to respond to vertical polarization of the infrared light; and a second meta key configured to respond to horizontal polarization of the infrared light.

11. The measurement optical system of claim 1, wherein the alignment key comprises:

a first alignment key; and a second alignment key spaced apart from the first alignment key, wherein a first one of the first alignment key and the second alignment key is a non-meta key, and wherein a second one of the first alignment key and the second alignment key includes the meta key.

12. The measurement optical system of claim 11, wherein an entirety of the second one of the first alignment key and the second alignment key is the meta key.

13. The measurement optical system of claim 11, wherein the second one of the first alignment key and the second alignment key further includes the non-meta key.

14. The measurement optical system of claim 1, wherein measuring the first overlay and the second overlay comprises:

controlling a vertical polarization of the infrared light to be incident on the alignment key, and, based on the vertical polarization of the infrared light being incident on the alignment key, measuring, in a vertical direction, the overlay of 300 nm or more and, in a horizontal direction, the overlay of 100 nm or less; and controlling a horizontal polarization of the infrared light to be incident on the alignment key, and, based on the horizontal polarization of the infrared light being incident on the alignment key, measuring, in the horizontal direction, the overlay of 300 nm or more and, in the vertical direction, the overlay of 100 nm or less.

15. The measurement optical system of claim 1, wherein the light splitter is configured to rotate about a single axis.

16. An overlay measurement method comprising:

measuring a first overlay by irradiating an alignment key of a subject with a first infrared light and by detecting a first reflected light reflected from the alignment key, the alignment key comprising a meta key and a first non-meta key; and measuring a second overlay by irradiating the alignment key with a second infrared light and by detecting a second reflected light reflected from the alignment key, the second infrared light having a wavelength that is different from a wavelength of the first infrared light, wherein a first one of the first overlay and the second overlay is measured based on the meta key, wherein a second one of the first overlay and the second overlay is measured based on the first non-meta key, wherein one of the measuring the first overlay and the measuring the second overlay comprises measuring an overlay of stacked substrates of the subject and of 300 nm or more, and wherein the other one of the measuring the first overlay and the measuring the second overlay comprises measuring an overlay of the stacked substrates of the subject and 100 nm or less.

17. The overlay measurement method of claim 16, wherein the alignment key comprises:

a first alignment key comprising the first non-meta key; and a second alignment key comprising the meta key, and wherein the second alignment key is spaced apart from the first alignment key.

18. The overlay measurement method of claim 17, wherein the second alignment key comprises the meta key and a second non-meta key.

19. A method of overlay measurement, the method comprising:

measuring a first overlay in a first direction by irradiating an alignment key of a subject with a first polarized infrared light and by detecting a first reflection light reflected from the alignment key, the alignment key comprising a meta key; and measuring a second overlay in a second direction perpendicular to the first direction by irradiating the alignment key with a second polarized infrared light and by detecting a second reflected light reflected from the alignment key, the second polarized infrared light having a polarization state that is perpendicular to a polarization state of the first polarized infrared light, wherein one of the measuring the first overlay and the measuring the second overlay comprises measuring an overlay of stacked substrates of the subject and of 300 nm or more, and wherein the other one of the measuring the first overlay and the measuring the second overlay comprises measuring an overlay of the stacked substrates of the subject of 100 nm or less.

20. The overlay measurement method of claim 16, wherein the measuring the first overlay comprises measuring the first overlay by irradiating a first alignment key of the alignment key with the first infrared light and by detecting the first reflected light reflected from the first alignment key, wherein the measuring the second overlay comprises measuring the second overlay by irradiating a second alignment key with the second infrared light and by detecting the second reflected light reflected from the second alignment key, and wherein the first alignment key comprises a same pitch, width, and height as the second alignment key.

21. The method of claim 19, wherein the meta key comprises:

a first meta key configured to respond to a vertical polarization; and a second meta key configured to respond to a horizontal polarization.

* * * * *